(12) United States Patent
Sullivan et al.

(10) Patent No.: US 10,759,084 B1
(45) Date of Patent: Sep. 1, 2020

(54) METHODS FOR MATERIAL SYNTHESIS AND MANUFACTURING USING SHOCK CONSOLIDATION

(71) Applicant: Oceanit Laboratories, Inc., Honolulu, HI (US)

(72) Inventors: Christopher Sullivan, Honolulu, HI (US); Ashavani Kumar, Sunnyvale, CA (US); Venkat Kamavaram, Honolulu, HI (US)

(73) Assignee: Oceanit Laboratories, Inc., Honolulu, HI (US)

( * ) Notice: Subject to any disclaimer, the term of this patent is extended or adjusted under 35 U.S.C. 154(b) by 682 days.

(21) Appl. No.: 15/185,006

(22) Filed: Jun. 16, 2016

Related U.S. Application Data

(60) Provisional application No. 62/180,593, filed on Jun. 16, 2015.

(51) Int. Cl.
| | |
|---|---|
| *B23K 26/00* | (2014.01) |
| *B28B 1/00* | (2006.01) |
| *C23C 16/26* | (2006.01) |
| *B23K 26/356* | (2014.01) |
| *B23K 26/70* | (2014.01) |

(Continued)

(52) U.S. Cl.
CPC .......... *B28B 1/001* (2013.01); *B23K 26/0006* (2013.01); *B23K 26/009* (2013.01); *B23K 26/356* (2015.10); *B23K 26/702* (2015.10); *B33Y 10/00* (2014.12); *C23C 16/26* (2013.01); *B23K 2103/52* (2018.08)

(58) Field of Classification Search
None
See application file for complete search history.

(56) References Cited

U.S. PATENT DOCUMENTS

| | | | |
|---|---|---|---|
| 4,599,060 A * | 7/1986 | Flinn | B22F 3/08 425/1 |
| 5,089,467 A * | 2/1992 | Murr | C04B 35/45 228/107 |
| 2002/0025272 A1* | 2/2002 | Witherspoon | B22F 3/087 419/66 |

OTHER PUBLICATIONS

Molian and Baerga, Laser Shock Wave Consolidation of Micropowder Compacts of Fully Stabilised Zirconia with Addition of Nanoparticles, 2011, Advances in Applied Ceramics, vol. 110 No. 2, pp. 120-123 (Year: 2011).*

* cited by examiner

*Primary Examiner* — Monica A Huson
*Assistant Examiner* — Kelsey C Grace
(74) *Attorney, Agent, or Firm* — Fresh IP PLC; Clifford D. Hyra; Aubrey Chen

(57) ABSTRACT

A shock consolidation material manufacturing method involves combining a nanoscale additive and ceramic nanoparticles to create a nano-powder, compacting the nano-powder mechanically, and performing shock-wave consolidation on the compacted nano-powder. The ceramic nanoparticles may be Yttria-stabilized tetragonal Zirconia (YSZ) or Samarium doped Ceria (SDC). The nanopowder may be CNT-YSZ or SDC-$Na_2CO_3$. The shock-wave consolidation may be performed with a laser, and may involve positioning the nano-powder on a support material, placing an ablative layer over the support material and nano-powder, placing a transparent re-usable capping layer over the ablative layer, and directing laser energy at the capping layer, turning an area of the ablative layer below the capping layer into plasma and generating shock waves through the nano-powder and support material.

28 Claims, 14 Drawing Sheets

(51) Int. Cl.
*B33Y 10/00* (2015.01)
*B23K 103/00* (2006.01)

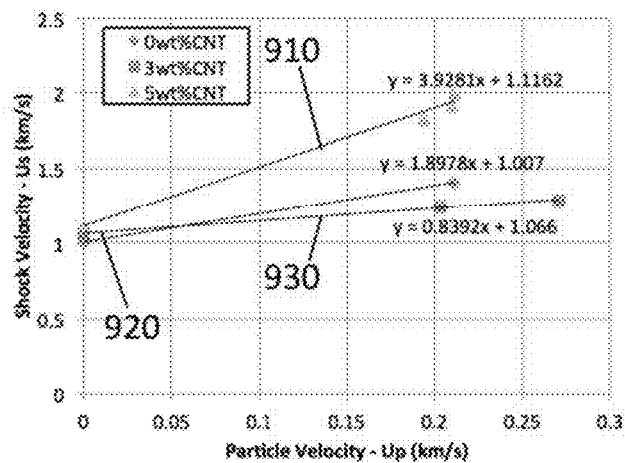
FIG. 9
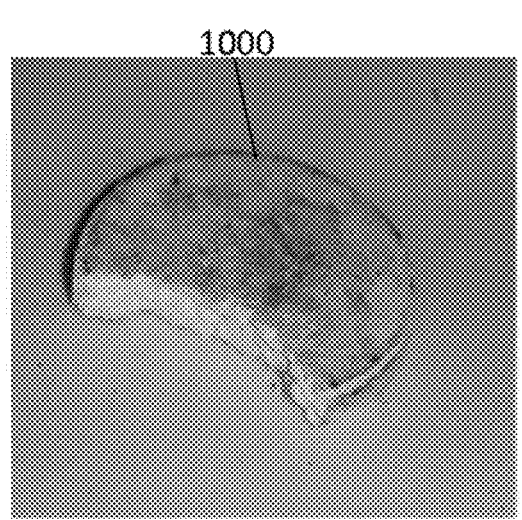 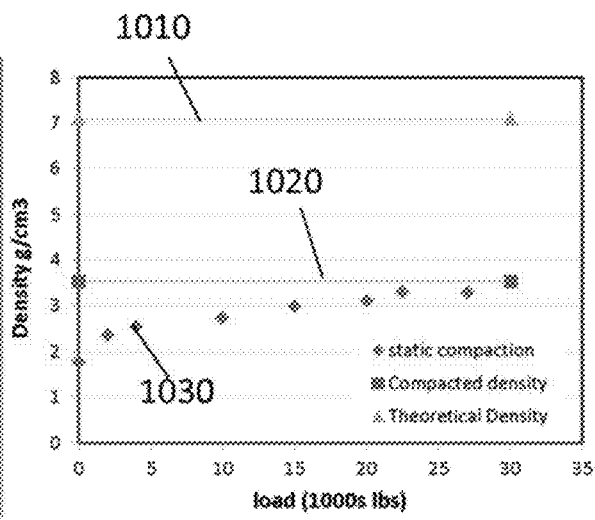
FIG. 10A            FIG. 10B

| Test | Hardness (Vickers) | a-CNT YSZ Hardness (GPa) | Young's Modulus (GPa) | Max Depth (nm) |
|---|---|---|---|---|
| 1 | 601.0 | 6.360 | 93.8 | 977 |
| 2 | 588.4 | 6.227 | 111.8 | 953 |
| 3 | 649.9 | 6.878 | 100.6 | 943 |
| 4 | 580.9 | 6.147 | 107.4 | 966 |
| 5 | 593.0 | 6.276 | 102.3 | 969 |
| Average | 602.7 | 6.378 | 103.2 | 962 |
| Standard Deviation | 27.4 | 0.290 | 6.8 | 14 |

METHODS FOR MATERIAL SYNTHESIS AND MANUFACTURING USING SHOCK CONSOLIDATION

This application claims the benefit of U.S. Provisional Application No. 62/180,593, filed Jun. 16, 2015, which is hereby incorporated by reference in its entirety.

This Invention was made with Government support under Contract FA9950-14-C-0047 awarded by AFOSR. The Government has certain rights in this invention.

FIELD OF THE INVENTION

The application relates generally to material synthesis, additive manufacturing, ceramics, shock consolidation of materials, material processing, and composites.

BACKGROUND

Conventional material processing techniques are limited to the production of materials close to the equilibrium state with very large grains and the loss of nanostructure dimensionality.

Conventional powder metallurgy processing techniques typically prepare materials from a melt or using powder metallurgy techniques, such as hot pressing or sintering, and produce materials with relatively large grains crystallites) and result in the loss of nanostructural properties. Materials design and processing approaches at or close to the equilibrium state can impose limitations on the properties of resulting materials. The production of multiphase composites is difficult or impossible using such techniques. Fabrication of metal matrix, metal-ceramic or reinforced ceramic composites is considered industrially important however, owing to a wide range of applications such as gas turbine and piston engine parts, orthopedic implants, transparent laser materials, remote sensing, chem-bio detection and space vehicles. The difficulty of controlling metastable phases within the composites, the loss of filler nanostructure dimensionality and aggregation of dopant or damage in the bulk materials limits mass production and use.

Current methods of processing utilizing shockwave consolidation are limited to shapes and sizes that are amenable to gas gun and explosive consolidation systems.

Ceramic materials have been an active field of research over the last few decades owing to excellent physical properties including high temperature stability, chemical inertness, strength, and wear resistance. This makes them suitable for a wide range of applications when many conventional metallic components would fail. The major limitation to use is brittleness, which restricts use in structural applications, and thus a significant effort has been placed in increasing toughness through the use of second phase reinforcements such as particulates and long/short fibers. Similarly, the incorporation of carbon nanotubes (CNTs), analogous to traditional micrometric fibers, is aimed at enhancing fracture toughness.

It is possible to incorporate carbon nanotubes (CNTs) and carbon nanofibers into 3Y-TZP ceramics using HIP or Spark Plasma Sintering (SPS), resulting in enhancement of mechanical and electrical properties. No significant enhancement is observed in fracture toughness, fracture strength or hardness however.

Tetragonal stabilized zirconia with 3 mol. % yttria (3Y-TZP) was down selected due to its relatively high strength and fracture toughness, ideal for many structural applications. It differs from other ceramics due to a stress-induced phase transformation. $ZrO_2$ has three different crystallographic forms depending on temperature. It exhibits a transformation toughening mechanism due to transformation from the monoclinic to the tetragonal phase that increases crack propagation resistance. This mechanism makes $ZrO_2$ much stronger compared to all other ceramic materials. Hence the true benefits of the reinforcement (second phase) n improving the mechanical properties of ceramic nanocomposite processed using thermal techniques is not clearly established.

Ceria is viewed as one of the most promising alternatives to yttrium stabilized zirconia for use in high temperature solid oxide fuel cells (SOFC) allowing lower temperature operation. Extensive development of ceria-based electrolytes has taken place. Super-ionic conductivity in samarium doped ceria nanocomposites is both theoretically and experimentally possible. This behavior may arise not from the SDC or $Na_2CO_3$ bulk, but from the interface between two constituent SDC and $Na_2CO_3$ phases, as illustrated in FIGS. 2A-B.

Solid sodium carbonate is a fast ionic conductor with negligible electronic conductivity at higher temperatures. The conductivity increases with increasing temperature. The pure salt exhibits a transition into a high temperature phase accompanied by a change of thermal expansion, rendering the production of al ng-term thermally stable sintered layer difficult. $Na_2CO_3$ is ferroelastic, developing a spontaneous strain below a phase transition from paraelastic to ferroelastic. Ferroelastic materials are defined as exhibiting multiple domains, or twins, which may be switched on with application of external stress. Such domain microstructures often result from phase transitions.

$Na_2CO_3$ has three synthetic polymorphs: two monoclinic ($\beta$ and $\gamma$) and one hexagonal ($\alpha$); these are stable in different temperature ranges. At 489° C., $Na_2CO_3$ undergoes $\beta$-monoclinic to $\alpha$-hexagonal ($C_2/m$ $P6_3/mmc$) ferroelastic phase transition that is driven by a planar elastic instability. The transition is ideal, continuous m=2 ferroelastic phase transition and it is reported to show complete lattice melting predicted by Landau theory. Since the melting point (851° C.) is much higher than the ferroelastic transition, it is termed as "melt-like phase." These phase transitions have a significant effect on the stability and conductivity of core-shell nanoparticles. Amorphous carbonate in the SDC-$Na_2CO_3$ composites may be tightly bonded to the surface of SDC nanocrystals to form an intimate shell layer via a long-range interface interaction, thereby minimizing crystalline $Na_2CO_3$ formation. This may be responsible for enhanced transport properties of oxide ions in the SDC-$Na_2CO_3$ composite electrolyte.

Extensive research has been devoted to stabilizing the high temperature phase at lower ambient temperatures by doping and high pressure to enhance conductivity, but without much success. High density forms are required for application in SOFC or other electrochemical cells.

Needs exist for improved material manufacturing methods.

SUMMARY

It is to be understood that both the following summary and the detailed description are exemplary and explanatory and are intended to provide further explanation of the invention as claimed. Neither the summary nor the description that follows is intended to define or limit the scope of the invention to the particular features mentioned in the summary or in the description.

In certain embodiments, the disclosed embodiments may include one or more of the features described herein.

A new shock consolidation material manufacturing method involves combining a nanoscale additive and ceramic nanoparticles to create a nano-powder, compacting the nano-powder mechanically, and performing shock-wave consolidation on the compacted nano-powder. The ceramic nanoparticles may include Yttria-stabilized tetragonal Zirconia (YSZ) and/or Samarium doped Ceria (SDC). The ceramic particles may include SDC and the nanoscale additive may include $Na_2CO_3$, the nano-powder may be core-shell SDC-$Na_2CO_3$, and the core-shell SDC-$Na_2CO_3$ particles may have SDC cores in a size range of 20-60 nm and $Na_2CO_3$ shells in a size range of 2-4 nm.

The shock-wave consolidation may be performed with a laser, and include positioning the nano-powder on a support material, placing an ablative layer over the support material and nano-powder, placing a transparent re-usable capping layer over the ablative layer, and directing laser energy at the capping layer, turning an area of the ablative layer below the capping layer into plasma and generating shock waves through the nano-powder and support material. The laser energy may be directed to a portion of the capping layer having spot size ds which is moved across the capping layer at a raster speed on the order of magnitude of the ratio of ds to a pre-determined characteristic consolidation process time tc of the nano-powder and support material. The laser energy may be directed using a linear array of lasers to a portion of the capping layer comprising a line of overlapping spots of size ds, which is moved linearly across the capping layer at a raster speed on the order of magnitude of the ratio of ds to a pre-determined characteristic consolidation process time tc of the nano-powder and support material. The laser energy may be directed in 5 mJ pulses 10 ns long of 1064 nm light focused to a spot size of 150 μm with an instantaneous power of 0.5 MW and intensity over the illuminated area of over 2.2 GW/cm2. The ablative layer may include glossy black paint.

The nanoscale additive may include carbon nanotubes comprising 1-3% by weight of the nano-powder. In other embodiments, the carbon nanotubes may comprise 0.5 to 10% by weight of the nano-powder. The shock-wave consolidation may be performed with a gas gun. The gas gun may be an 80-mm barrel diameter, 10 m, single-stage light gas gun with three-capsule fixture and a velocity of 1050 m/s.

The shock-wave consolidation may occur within a microsecond timescale.

The method may also include placing the nano-powder on a surface of a support material in a predetermined design, such that some portions of the support material surface are not covered by the nano-powder, and pressing a continuous glass piece over the entire surface of the support material, where the shock-wave consolidation is performed on the entire surface. The method may also include placing further nano-powder on the shock-wave consolidated surface in a predetermined design, such that some portions of the shock-wave consolidated surface are not covered by the nano-powder, pressing a continuous glass piece over the entire surface of the shock-wave consolidated surface, and performing further shock-wave consolidation on the entire shock-wave consolidated surface. A binding layer may be placed over the shock-wave consolidated surface before placing the further nano-powder. An ablative layer may be placed over the support material surface and below the glass piece.

Compacting the nano-powder mechanically may include die pressing it under a 350-400 MPa load. Combining a nanoscale additive and ceramic nanoparticles to create a nano-powder may involve ball milling the nanoscale additive with the ceramic particles. Combining a nanoscale additive and ceramic nanoparticles to create a nano-powder may include growing carbon nanotubes on the ceramic nanoparticles using chemical vapor deposition. Combining a nanoscale additive and ceramic nanoparticles to create a nano-powder may involve growing the ceramic nanoparticles on carbon nanotubes by functionalizing multi-walled carbon nanotubes with carboxylic groups using an acid treatment to ensure a hydrophilic surface, followed by attachment of the ceramic nanoparticles using a hydrothermal process. The hydrothermal process may include dissolving of the ceramic nanoparticles in water, addition of the multi-walled carbon nanotubes, and heating in a pressure reaction vessel, further comprising removing a layer of floating solids and removing ceramic-CNTs therefrom.

A new material may be manufactured by the methods described above.

These and further and other objects and features of the invention are apparent in the disclosure, which includes the above and ongoing written specification, with the drawings.

BRIEF DESCRIPTION OF THE DRAWINGS

The accompanying drawings, which are incorporated herein and form a part of the specification, illustrate exemplary embodiments and, together with the description, further serve to enable a person skilled in the pertinent art to make and use these embodiments and others that will be apparent to those skilled in the art.

FIG. 9 shows particle velocity and shock velocity Hugoniot as a function of percent CNT. The elastic sound speed has been included for clarity.

FIGS. 10A-B show a compacted sample and static compaction density measurement, respectively.

DETAILED DESCRIPTION

Figure 1:
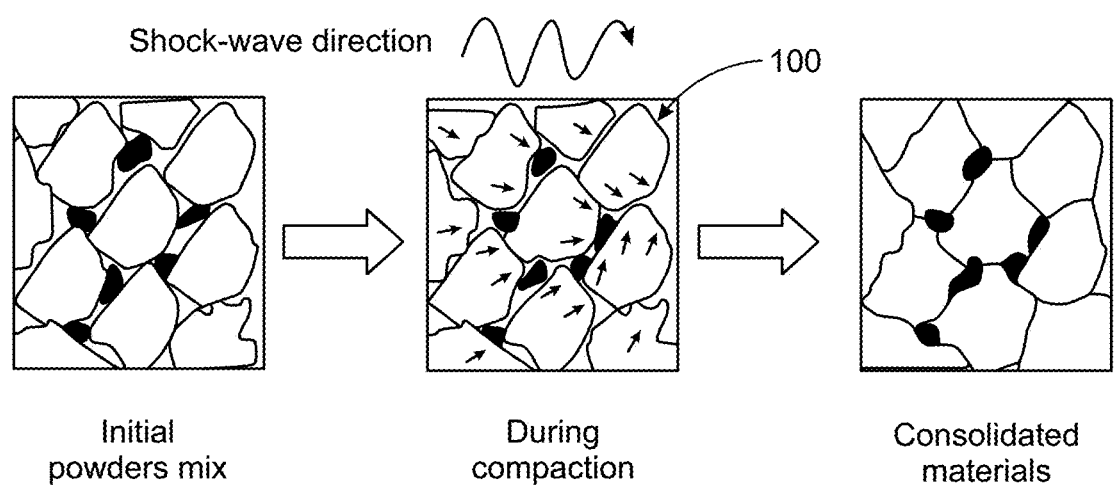
FIG. 1 is a schematic view of a shock-wave consolidation process illustrating the effect in the powder material grains.
Figures 2A, 2B:
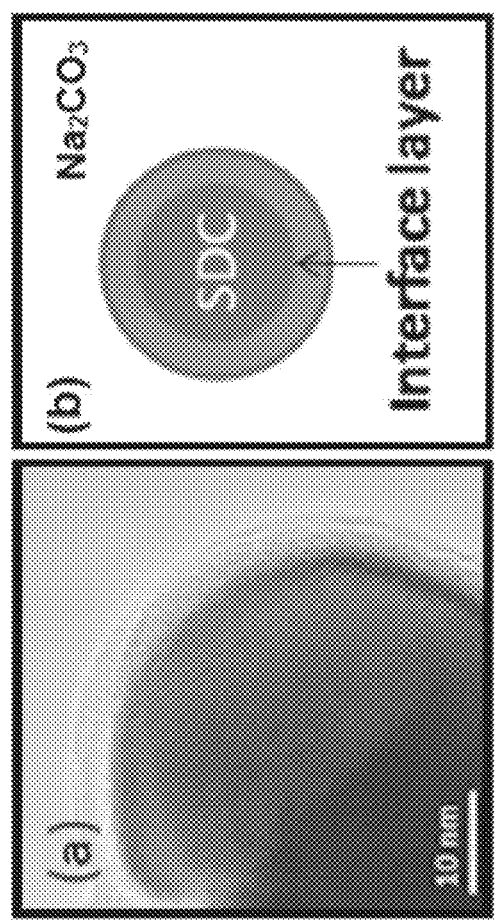
FIGS. 2A-B show aa) TEM image of core-shell SDC-$Na_2CO_3$ nanoparticle and)) interface and bulk conductivities in SDC-$Na_2CO_3$ composite electrolyte.

Shock consolidation material manufacturing methods and materials made thereby will now be disclosed in terms of various exemplary embodiments. This specification discloses one or more embodiments that incorporate features of the invention. The embodiment(s) described, and references in the specification to "one embodiment", "an embodiment", "an example embodiment", etc., indicate that the embodiment(s) described may include a particular feature, structure, or characteristic. Such phrases are not necessarily referring to the same embodiment. When a particular feature, structure, or characteristic is described in connection with an embodiment, persons skilled in the art may effect such feature, structure, or characteristic in connection with other embodiments whether or not explicitly described.

In the several figures, like reference numerals may be used for like elements having like functions even in different drawings. The figures are not to scale. The embodiments described, and their detailed construction and elements, are merely provided to assist in a comprehensive understanding of the invention. Thus, it is apparent that the present invention can be carried out in a variety of ways, and does not require any of the specific features described herein. Also, well-known functions or constructions are not described in detail since they would obscure the invention with unnecessary detail.

The description is not to be taken in a limiting sense, but is made merely for the purpose of illustrating the general principles of the invention, since the scope of the invention is best defined by the appended claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items. As used herein, the singular forms "a", "an" and "the" are intended to include the plural forms as well, unless the context clearly indicates otherwise.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

New methods to improve conventional shock consolidation processes include nanoparticles, such as carbon nanotubes, in such a way as to reduce compaction effort and improve consolidation properties, such as density and toughness. New methods allow manufacture of shock consolidated materials in any arbitrary shape, composition, and size through an additive manufacturing, or three-dimensional printing technique. New methods produce composites comprised of core-shell and/or multilayer core-shell nanomaterials and micromaterials by means of shock consolidation, with and without nanoparticle additives for improved mechanical and multifunctional properties, using conventional shock consolidation approaches as well as additive manufacturing methods.

In embodiments, these new methods improve on the existing state of the art in multiple ways. The new methods improve material synthesis using shock consolidation by creating more optimally compacted materials through the use of additives, for example carbon nanotubes, that improve the compaction process, for example, by reducing friction between elements of the pre-shock consolidated material such that greater compaction can be achieved without degrading the element-to-element bonding processes. The methods also allow shock consolidated materials in the form of three-dimensional objects of any arbitrary shape and size to be produced. The methods may be used to produce three dimensional objects with properties that vary in composition and properties on a point to point basis. Using these methods, materials that are only producible using shock consolidation methods may be produced in any size and shape and in combination with other materials, and materials of previously unobtainable properties can be produced in arbitrary shapes and sizes. Some of the materials include high performance ceramics, multifunctional ceramics, transparent laser materials, reactive materials, room temperature superconducting materials, super-ionic conducting membranes and materials, etc.

Two new shockwave consolidated nanocomposite systems, carbon nanotube (CNT) reinforced Yttria-stabilized tetragonal Zirconia (YSZ) and core-shell Samarium doped Ceria-sodium carbonate (SDC-$Na_2CO_3$), may be manufactured using two new consolidation methodologies: a high-pressure gas-gun (e.g. ¼" and 2" configurations) and laser shockwave consolidation with a pulsed laser (e.g. Nd:YAG). These methodologies may be used to synthesize meta-stable phases of hierarchically nanostructured heterogeneous materials for both nanocomposite systems. These two systems (nanostructured ceramics) exhibit significant improvements in mechanical and electrical properties and preserve their nanostructured morphology.

Gas gun shockwave consolidation of CNT-YSZ nanocomposites with CNT concentrations 1-3 wt % results in highly compacted material with improved hardness and elastic modulus attributed to increased density. Gas-gun shockwave consolidated 3% CNT-YSZ showed a significant improvement in hardness (150%) and Young's modulus (340%) compared to similarly consolidated base YSZ.

High-resolution TEM images reveal that CNTs are embedded between YSZ particles, providing improved bonding leading to increased densification and mechanical properties. In addition, the structural integrity of CNTs is retained even after ball milling during fabrication and 2.5 GPa shock pressures during consolidation.

Laser consolidated 3 wt % CNT-YSZ shows significant improvement in hardness (900%) and Young's modulus (500%) compared to consolidated YSZ alone.

Core-shell $SDC-Na_2CO_3$ nanoparticles with size range of 20-60 nm (core) and 2-4 nm (shell) may be synthesized and shock consolidated and exhibit super-ionic conductivity of >0.1 S/cm in the temperature range 400 to 600° C., four orders of magnitude higher than state-of-the-art ceria doped oxide electrolyte, while retaining the nanostructured morphology of the precursor powder.

Shockwave consolidation techniques enable the development of new materials with desirable, tailorable properties, particularly with the utilization of nano-powders.

New multiple nano-powder-based shock consolidated materials may be produced with hierarchically stable: micro- and nano-structures, including carbon nanotube-reinforced yttria stabilized zircon a (CNT-YSZ) and samarium doped ceria-sodium carbonate ($SDC-Na_2CO_3$) with hierarchical core-shell nanostructures.

To create the new materials, ceramic nano-powders may be fabricated using scalable processes such as those described herein, compressed and then shock consolidated using gas gun or laser shock consolidation processes.

A scale-up pathway employs laser shock consolidation that is compatible with additive manufacturing.

Single-step consolidation of powders using high pressure shock-waves (~3-15 GPa) generated by planar impact, explosives or other methods is a solution for synthesis and processing of bulk nanocrystalline materials. Shock-wave compaction (SWC) occurs within a microsecond timescale (~100 ns), resulting in heterogeneous deposition of delivered energy and inter-particle bonding resulting in changes to particle configuration that impacts the structure of dislocations, sub-grains, distortions and partially melted regions. FIG. 1 illustrates the effect of a shock-wave consolidation process on powder material grains 100.

Shockwave consolidation processed dense monolithic bulk or composite materials can exhibit significantly different physical behavior from samples densified using conventional powder processing techniques involving sintering steps at high temperature. Rapid consolidation of powders by SWC can result in a bulk material that retains nano-sized features. This is due to the limited heating that takes place on the surfaces of the particles over a very short timescale.

A shock consolidation approach may be used for synthesis of carbon nanotube (CNT) reinforced multiphase ceramic materials, resulting in ceramics with improved mechanical, electrical and thermal properties. Additionally, core-shell nanoparticle structures are useful in such materials. Two materials in particular may be created by shock consolidation processing: a multiphase reinforced ceramic composite and a core-shell super-ionic conducting ceramic electrolyte.

New methods of shockwave consolidation may be used with $SDC-Na_2CO_3$ to maintain nanostructural features as overall density is increased, and laser shockwave consolidation may allow for a scaled manufacturing process of optimal layers of around 1 mm thickness. Laser shockwave consolidation can only be used to create relatively thin layers, so a layering process is necessary to achieve materials with greater thickness.

Figures 12A, 12B:
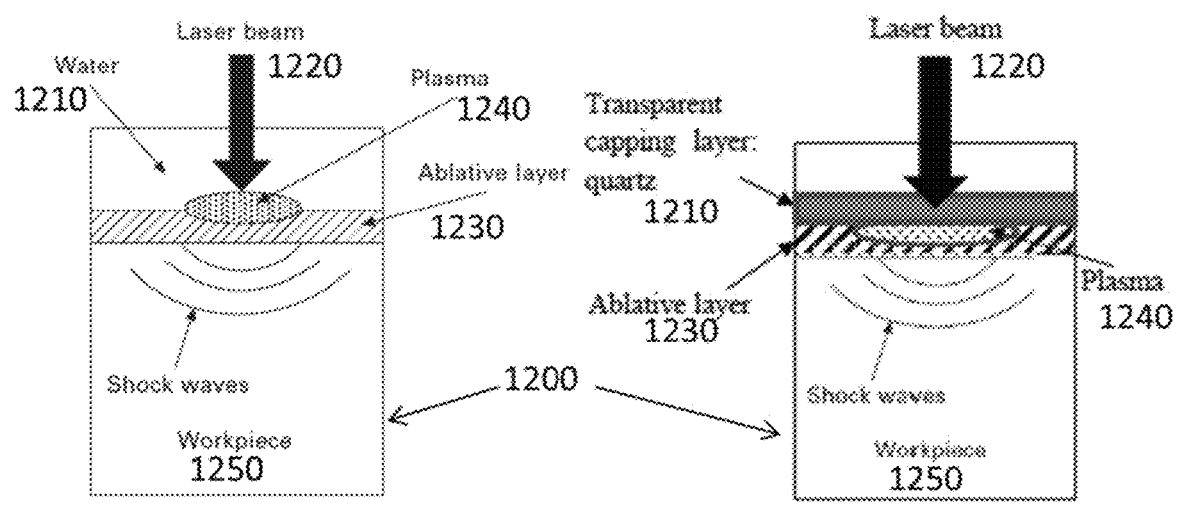
FIGS. 12A-B illustrate laser shock processing improvements—previously used configuration (FIG. 12A), and improved configuration (FIG. 12B). A solid but transparent capping layer made of quartz, for example, produces a more desirable boundary condition.

A new additive-manufacturing-process-compatible laser-shock-consolidation process takes a new approach, employing a quartz cover slide to overcome issues associated with discrete shock processing events. FIGS. 12A-B show improved laser shock processing configurations 1200. A solid but transparent capping layer 1210 made of quartz, for example, produces a more desirable boundary condition. Any material that is transparent to the laser being used and provides a to direct the forces generated by laser ablation towards the consolidating material may be used for the capping layer, including liquids such as water. A laser beam 1220 is directed through the capping layer 1210 to ablative layer 1230, generating an expanding plasma region 1240 that creates shock waves through workpiece 1250.

Figure 23:
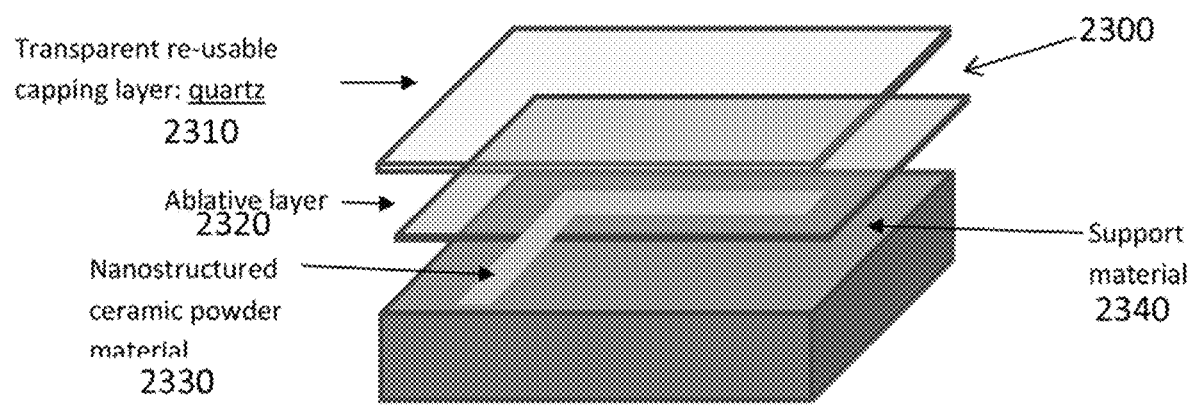
FIG. 23: New laser shock processing configuration

As part of an additive manufacturing method this may be achieved layer by layer by first laying out a pattern with each "pixel" as support material (sometimes referred to as "filler material," used in 3D printing to allow depositing an otherwise unsupported layer) or nanostructured ceramic powder, then pressing a continuous glass piece over the entire layer and subsequently shock consolidating that layer. Subsequent layers may be combined by either direct consolidation of the next layer of material, or by introducing a binding layer in between successive layers. The binding layer may be made of any material that binds adjacent layers, and is as thin as possible. FIG. 23 illustrates such a setup 2300 in an exploded view, with capping layer/quartz glass piece 2310, ablative layer 2320, nanostructured ceramic powder material 2330, and support material 2340.

In a method where consolidation happens on a point-by-point basis, careful attention must be paid to the state of the material in overlapping regions. Power at the outer edge of a laser spot is reduced, leading to less consolidation along the edges of the laser path. As there will be a frontier between fully consolidated regions and unconsolidated regions, the effect of laser induced shockwaves on the material in different regions may vary. Modifications to the topology of the ablative layer, materials layers and/or lasing configuration may be employed as required. Additionally, preheating may be employed, or pre-stressing (e.g. compressing, pressurizing), to reduce laser power requirements, leading to more complete consolidation even at edges, and reduce thermal stress.

Figure 24:
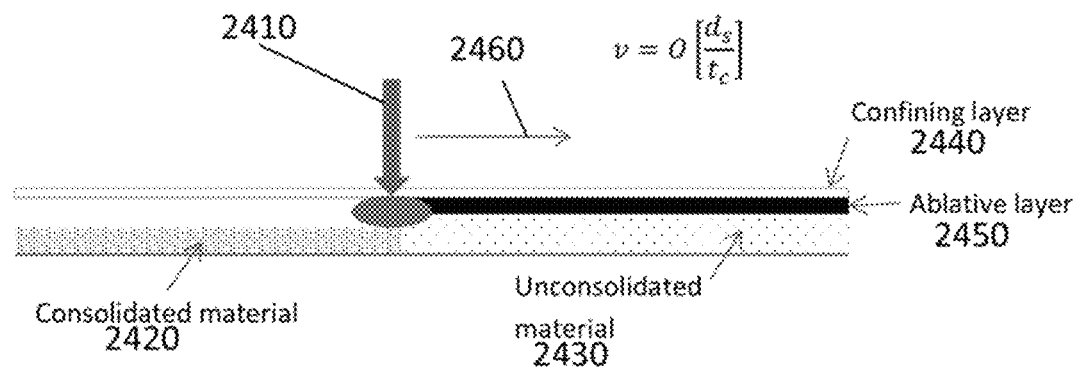
FIG. 24: Continuous laser shock processing method creating a continuous line.
Figure 25:
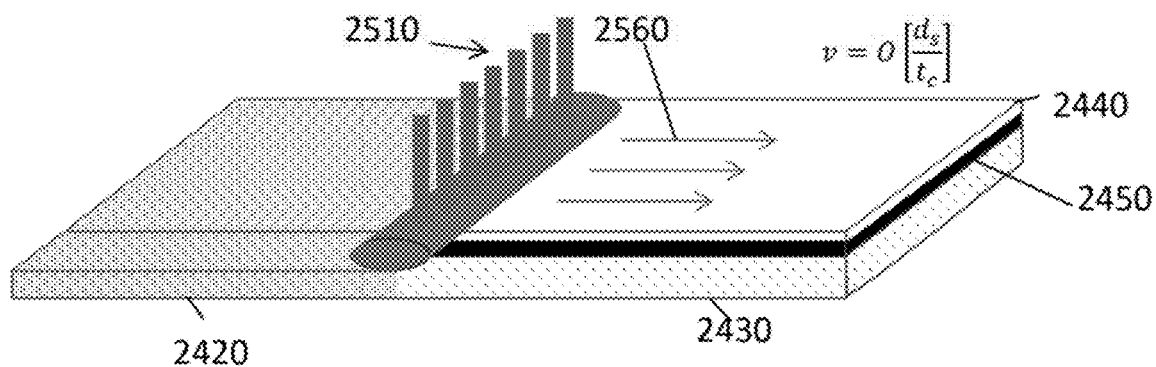
FIG. 25: Continuous laser shock processing method creating a continuous surface.

Another method that may be employed is the production of a larger laser shock event that processes the material in fewer steps using an array of lasers along one direction and a limited scanning process in the other direction. In this way, the consolidation occurs in a continuous manner, analogous to "keeping a wet edge" while painting. The raster speed of the laser for this purpose is on the order of the ratio of the spot size, ds, divided by the characteristic consolidation process time, tc. FIG. 24 illustrates a continuous laser shock processing method creating a continuous line, with laser beam 2410 moving in direction 2460, directed through confining layer 2440 to ablative layer 2450, which turns into plasma beneath the beam and consolidates the unconsolidated material 2430 into consolidated material 2420 as it passes. FIG. 25 illustrates a continuous laser shock processing method creating a continuous surface, with an array of laser beams 2510 moving in linear direction 2560.

Figure 26:
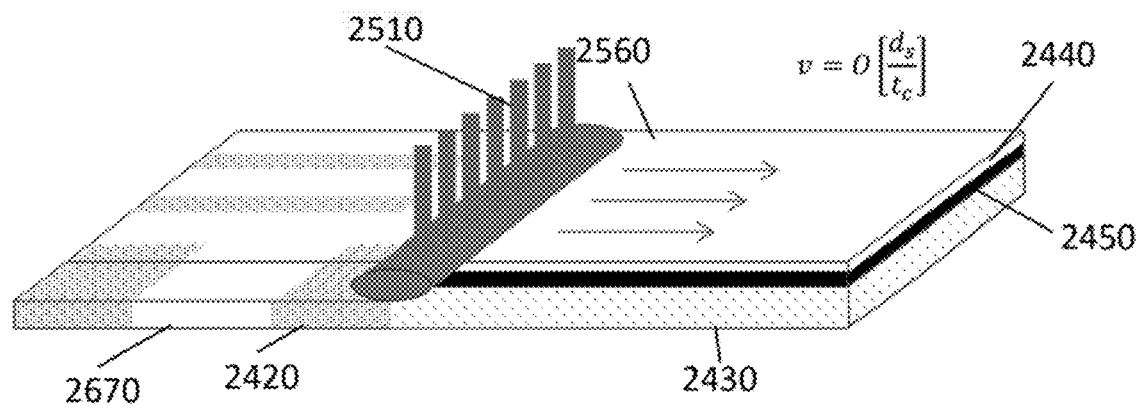
FIG. 26: Additive manufacturing of three-dimensional structures is achieved by selective layout of patterns of support material and consolidating material in a layer by layer method.

Intricate patterns may be created by depositing unconsolidated material for a single layer in a particular pattern. Done in sequential building layers with a binding material in between each layer, a composite material of shock consolidated layers can be created in any geometry. FIG. 26 illustrates additive manufacturing of three-dimensional structures by selective layout of patterns of support material and consolidation of material in a layer by layer method, with consolidated material 2420 being left in regions where nanostructured ceramic powder was placed, and other regions 2670 being areas where no powder was placed on the support material.

Two example nanocomposite system manufacturing processes using shockwave-driven processing techniques are described below. These manufacturing processes resulted in the following nanocomposite systems:

System 1:
Carbon nanotube (CNT) reinforced Yttria stabilized tetragonal Zirconia (YSZ) with high hierarchical stability; and
System 2:
Core-shell $Na_2CO_3$-Samarium doped cerium oxide (SDC) nanocomposite with super-ionic conductivity Example System 1—CNT Reinforced YSZ
Composite Synthesis of Nano-powders Three types of fillers were investigated for the production of CNT reinforced YSZ composite: CNTs mechanically mixed with YSZ, CNTs grown on YSZ nanoparticles via chemical vapor deposition (CVD) and $ZrO_2$ nanoparticles grown on CNTs via a hydrothermal process. These fillers were used to evaluate the impact of interfacial bonding between filler and matrix on the mechanical properties of the nanocomposite. Commercially available Yttria stabilized Zirconium (IV) oxide (YSZ) nanoparticles (~700 nm) were used.

CNTs Mechanically Mixed with YSZ

Multiwalled carbon nanotubes (MWCNTs) were mechanically mixed with YSZ nanoparticles via ball milling for 20 hrs with 30 min ON/OFF cycles to prevent overheating of the contents. Milling time was optimized through periodic morphological analysis of the mixture with the aim of minimizing damage to the CNTs and resulting amorphous carbon formation on the YSZ nanoparticles. SEM imaging of 5 wt % CNT-YSZ ball milled for 20 hrs shows that the CNTs are thoroughly distributed and non-tangled.

CNTs Grown on YSZ Nanoparticles

Carbon nanotubes were grown on YSZ particles using chemical vapor deposition. The first step involved deposition of catalyst on the zirconia particles. In a typical procedure, a pre-weighed amount of Nickel acetate [Ni$(CH_3COO)_2$ $4H_2O$] was dissolved in 100 ml of Ethanol, 20 g of YSZ nanoparticles were added and sonicated for 1 hr. The solution was heated on a hot plate at 80° C. under vigorous stirring to promote rapid evaporation of ethanol. The obtained powder was calcined at 450° C. for 1 hr. This step results in zirconia coated with NiO catalyst, which was ground to powder for subsequent CNT growth. In the second step, carbon nanotubes were grown on the zirconia nanopowder. In a typical process, catalyst-loaded zirconia nanoparticles were heated to 700° C. under Ar flow (100 sccm). A pretreatment, 30 min under $H_2$ flow (100 sccm), was performed in order to reduce NiO. Next, to promote CNT growth, a mix of ethylene, $H_2$, and argon flow at 5:100:100 sccm was passed. A high density of CNT was observed from SEM.

Figure 3:
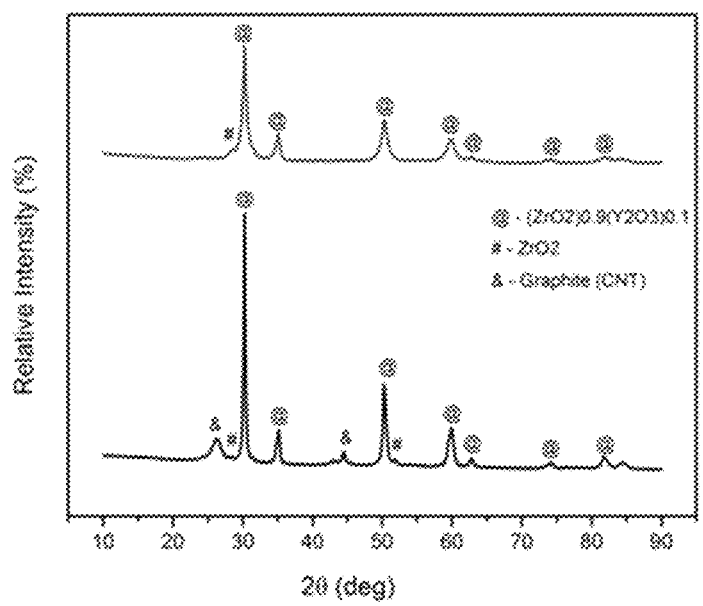
FIG. 3 shows the X-ray diffraction pattern of YSZ nanoparticles before and after CNT growth via CVD process.

X-ray diffraction was performed on the sample before and after the CVD process to identify the phases. X-ray powder diffraction (XRD) patterns were recorded on a Panalytical® X'Pert diffractometer using Cu radiation at 45 KV/40 mA. Scans were run over the range of 5° to 90° with a step size of 0.0167 and a counting time of 250 seconds per step. Phase identification was obtained from the powder diffraction database published by International Centre for Diffraction Data (ICDD). X-ray diffraction (XRD) analysis showed peaks corresponding to YSZ and multi-walled CNTs as shown in FIG. 3.

Figure 4:
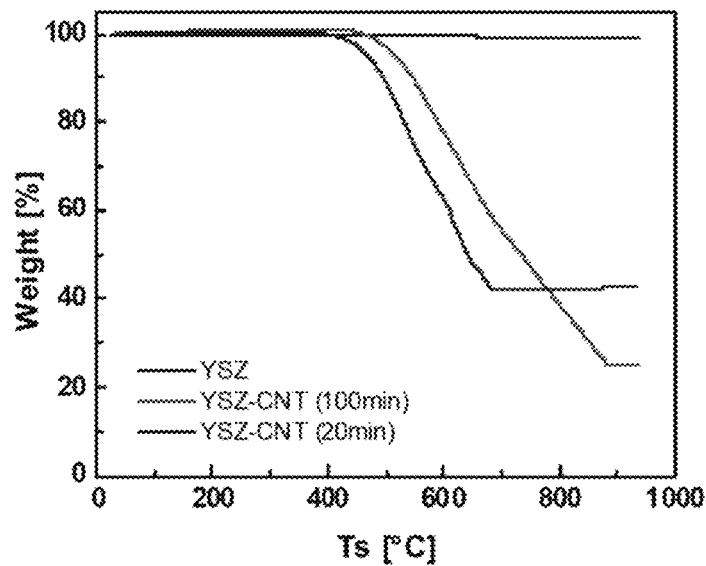
FIG. 4 shows a thermogravimetric analysis (TGA) of YSZ and CNT-YSZ samples.

Carbon nanotube loading on YSZ was evaluated using thermogravimetric analysis (TGA) from 30 to 1000° C. at 10° C.·min$^{-1}$ in air as shown in FIG. 4. Carbon nanotubes are completely oxidized below 700° C. while YSZ is stable, hence weight loss corresponds to oxidation and loss of CNTs. Content varied from 60 wt. % for 20 min and 75 wt. % for 100 min growth. Subsequent CNT growth reduces with time due to a decrease in catalyst activity.

Zirconia Nanoparticle Growth on CNTs

Growth of Zirconia nanoparticles on CNTs was carried out using a two stage method. The first step involved functionalization of MWCNTs with carboxylic groups using an acid treatment to ensure that the surface was hydrophilic. This was followed by attachment of zirconia nanoparticles using a hydrothermal process. A solution was prepared by dissolving 0.96 g of zirconium(IV) oxychloride octahydrate $ZrOCl_2.8H_2O$) in 10 ml of $H_2O$, 0.02 g multi-walled carbon nanotubes (MWCNT) was added to the solution and sonicated for 2 hrs before transferring to the pressure reaction vessel (steel container with Teflon liner). The reaction vessel was heated to 150° C. for 12 hrs. Two different layers of solids were observed after the reaction, one layer floating at the meniscus and the one settled at the bottom of reactor. The zirconia-CNTs from both the layers were separated and dried.

Carbon nanotube loading on the CNT-$ZrO_2$ reaction product was evaluated using TGA from 30 to 800° C. at 10° C.min$^{-1}$ in air. CNTs decompose at 600° C. and the remaining is $ZrO_2$. The CNT content was determined to be about 20 wt. % in the settled layer and about 80 wt. % in the floating (decanted) layer. This shows that the settled layer had majority of precipitated $ZrO_2$ while the floating layer (decanted) had $ZrO_2$ attached to CNTs. The TEM analysis of both the layers was analyzed to confirm the observation.

TEM images of the sample (decanted layer) indicate that the $ZrO_2$ nanoparticles are homogeneously distributed on the sidewalls of the MWCNTs. The particles are al (2-5 nm) and elongated (5-10 nm long with diameter: 2-3 nm). The sample from the settled layer showed large agglomerates of $ZrO_2$ that were not attached to CNTs.

Each of the three fillers appears to be acceptable for use in a shockwave compaction process. Further experimentation was performed on mechanically mixed CNT-YSZ nanocomposite formulations (1-5 wt. %) alone as described below. The other fillers may be useful to improve wettability between CNTs and CNT-YSZ compared to the mechanically mixed formulations, improving dispersion and bonding between CNTs and ceramic particles, providing high surface area and a compatible chemical interface between CNT-YSZ and resulting in improved density upon compaction and consequent improvement of mechanical properties.

Example System 2—Samarium-doped Cerium Oxide (SDC)-$Na_2CO_3$ Core-Shell Nanoparticles—Synthesis of Nano-Powders Samarium doped Cerium oxide-$NaCO_3$ core-shell nanoparticles were synthesized using a procedure reported in the literature. As-prepared SDC precursor was mixed with a $Na_2CO_3$ solution (2 mol L$^{-1}$) with vigorous stirring at a 4:1 weight ratio SDC:$Na_2CO_3$. The resultant slurry was dried at 80° C. in air for 24 hrs, calcinated at 700° C. in air for 1 hr and immediately cooled to room temperature to form a SDC-$Na_2CO_3$ composite. $Na_2CO_3$ weight content in the composite estimated from reaction materials balance calculations was about 10%.

Thermogravimetric analysis showed a weight loss of % below 400° C. This was attributed to decomposition of unreacted chemicals and thus the synthesized $Na_2CO_3$-SDC was calcined at 700° C. The TGA, of the calcinated material showed no weight loss until 900° C., confirming that SDC and $Na_2CO_3$ are stable in this temperature range. The onset of weight loss beyond 900° C. is attributed to $Na_2CO_3$ decomposition.

Figure 5:
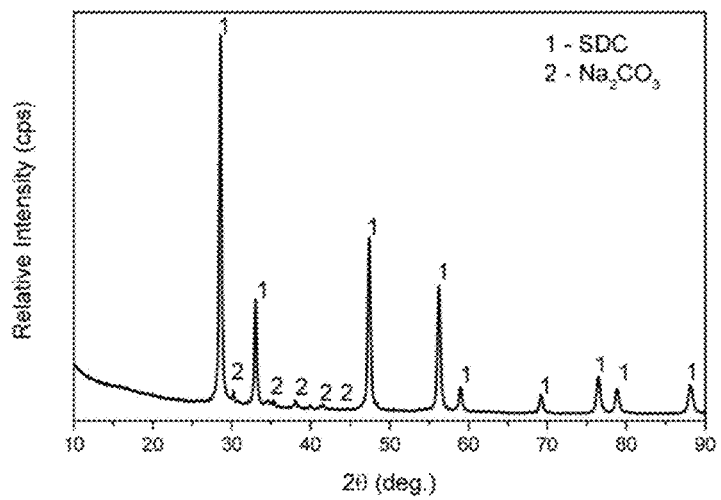
FIG. 5 shows the XRD pattern of core-shell $Na_2CO_3$-samarium doped cerium oxide (SDC) nanoparticles annealed at 700° C. in air

TEM analysis revealed that the synthesized SDC-$Na_2CO_3$ nanoparticles were faceted with a size range of 20-60 nm. A large contrast between the inner and the outer regions of the nanoparticle indicates that it has a core-shell structure. The SDC nanoparticles are surrounded by a uniform $Na_2CO_3$ layer of 2-4 nm. XRD showed peaks corresponding to $Na_2CO_3$ and SDC as shown in FIG. 5. Low intensity wide peaks for $Na_2CO_3$ indicate that the phase is amorphous.

After the nanocomposite systems (CNT-YSZ and $Na_2CO_3$-SDC) were synthesized and characterized, the nano-powders were compacted in a 13 mm steel die prior to shock compaction.

Example Procedures 1 and 2—Shock Wave Consolidation of Nanocomposites

In bath example procedures, shock-wave consolidation of ceramic nanocomposite materials was performed using a half-inch gas-gun shock tube facility and a 2-inch shock tube facility. Laser shock processing using a Q-switched Nd:YAG laser (1064 nm, 11.0 Hz, 10 ns pulse) was also performed.

High Pressure Gun Consolidation

The half-inch gas-gun shock tube facility was used for compacting CNT-YSZ samples. A one-dimensional flyer plate configuration test cell was utilized. The responses of the samples were monitored with a manganin gage embedded in the buffer on the front side of the target and a Photo Doppler Velocimetry (PDV) system which monitored the particle velocity at the sample-PMMA window interface.

Figures 6A, 6B:
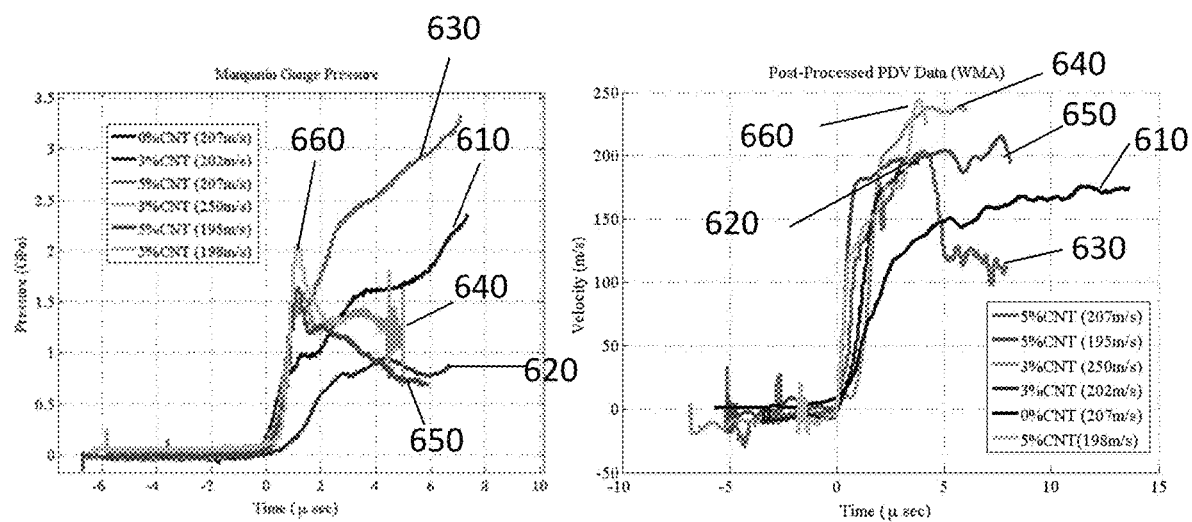
FIGS. 6A-B show manganin gage data from 175 m/s impact velocity for YSZ (0% CNT) and YSZ-CNT (3 & 5 wt. %).
Figure 7:
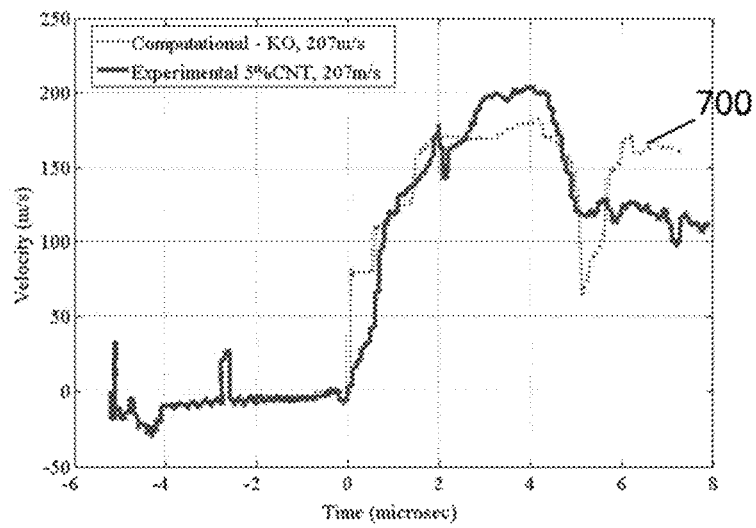
FIG. 7 is a comparison of experimental results and hydrocode simulation to insure timing of the experiment and verify the one-dimensional nature of the shock loading.

Several preliminary shots were executed to calibrate the system and ensure the test cell design. FIG. 6A presents several manganin gage traces and FIG. 6B presents several of the corresponding PDV velocity traces at a variety of shot velocities, corresponding to 0% CNT 610, 3% CNT (202 m/s) 620, 3% CNT (207 m/s) 630, 3% CNT (250 m/s) 640, 5% CNT (195 m/s) 650, and 5% CNT (198 m/s) 660. The arrival time of each trace has been shifted such that the wave profiles may be directly compared. The traces indicate the Hugoniot state of the incident wave generated from the copper flyer impacting the aluminum driver plate. One-dimensional hydrocode simulations, KU, were also performed to insure the timing of the experiments and verify the response vas one-dimensional over the duration of the Flugoniot state. An example of the hydrocode simulation 700 for a 5% CNT shot is presented in FIG. 7.

Figure 8:
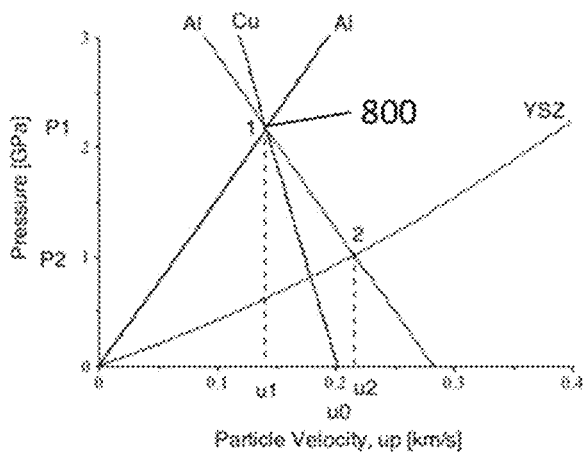
FIG. 8 shows an example of impedance matching through the target geometry in order to determine the particle velocity at the Hugoniot state for the YSZ sample, $u_2$.

From these measurements, the shock speed was obtained by knowing the arrival time of each gage and the sample thickness. The particle velocity in the sample at the shock state, $u_0$, was determined by impedance matching the shock transit path starting from the copper-aluminum impact 800; an example of which is presented in FIG. 8.

The resulting Hugoniot states in shock velocity, $U_s$, and particle velocity, $U_p$, space are presented in FIG. 9. In addition to the Hugoniot states, the longitudinal elastic sound speeds, as measured from an Olympus 5058PR pulser-receiver, are also presented for each sample in FIG. 9. A straight line fit is included for reference for 0 wt % CNT 910, 3 wt % CNT 920, and 5 wt % CNT 930. These results indicate that the dynamic response of the 3% CNT is below that of the 0% CNT dynamic response, which means the 3% CNT samples have compacted to a higher density. This is counter-intuitive to the idea that a higher percentage of CNT would result in a stiffer response of the target. With the measured particle velocity and shock velocity, the mechanical state of the YSZ can be determined from the Rankin-Hugoniot equations, the results of which are presented in Table 1. From these results, it is clear the 3% CNT achieves higher density.

Table 1

Shock Hugoniot states achieved in the YSZ as a function of percent CNT.

| Percent CNT | Shot Velocity, $u_0$ [m/s] | Particle Velocity, $u_2$ [m/s] | Shock Velocity, Us [m/s] | Pressure [GPa] | Shock Density, $\rho_2$ [g/cc] |
|---|---|---|---|---|---|
| 0 | 207 | 211 | 1.41 | 0.98 | 3.88 |
| 3 | 202 | 203 | 1.25 | 0.835 | 3,94 |
| 3 | 250 | 271 | 1.29 | 1.15 | 4.18 |
| 5 | 207 | 211 | 2.00 | 1.394 | 3.69 |
| 5 | 198 | 210 | 1.93 | 1.335 | 3,70 |
| 5 | 200 | 194 | 1.83 | 1.173 | 3.69 |

Shock-compaction of $Na_2CO_3$-SDC samples was performed using an 80-mm barrel diameter, 10 m, single-stage light gas gun. A three-capsule fixture was used with a velocity of 1050 m/s. Following the impact experiment, the samples were removed from the fixture via machining using a lathe. FIG. 10A shows the shock consolidated sample 1000. The final dimensions of the recovered compact were measured, from which the density was calculated as shown in FIG. 10B. It can be seen from the static 1030 and compacted 1020 density data of the shock-consolidated powder compact that the sample showed lower densification (compacted MID: 49.7% and assumed density: 7.1 g/cc) and extensive micro- and macro-cracking was observed due to lack of complete densification. Theoretical density 1010 is also shown.

Laser Shockwave Consolidation (LSC)

Figure 11:
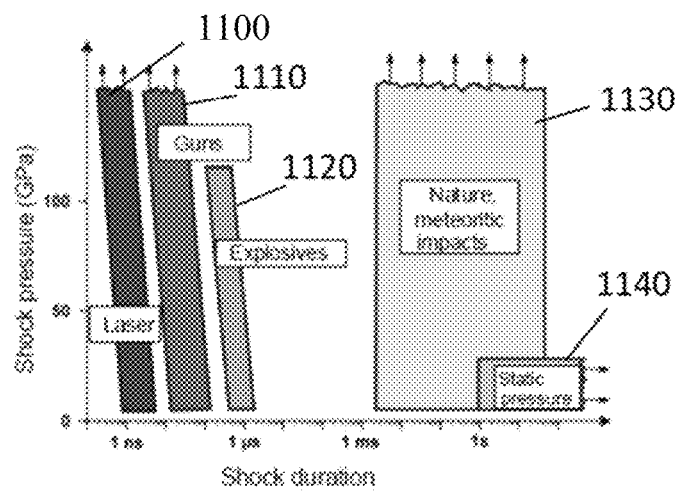
FIG. 11 shows shock duration versus shock pressure for various shock generators.

The laser peening process alters the microstructure and stress state without causing heat damage or material removal by using single shot, nanosecond laser pulses of extreme intensity and absorptive layers on the surface. Laser power density on the material surface is so high that optical breakdown occurs. Subsequent plasma generation and direct ablation of the absorptive layer can produce recoil pressures in the gigapascal range (as shown in FIG. 11 comparing shock pressure and duration of different shocks from lasers 1100, gas guns 1110, explosives 1120, natural/meteoritic impacts 1130, and static pressures 1140). Confining plasma during its expansion by a dielectric medium (water or glass) strongly imposes the pressure waves on the substrate material. Rapid expansion of high pressure plasma creates a shock wave that propagates through the material, creating dislocations and inducing plastic deformation. Thus, the material experiences high strain/strain rates, leading to major changes in the microstructure and improved surface properties such as hardness and fatigue strength.

In the example methods, a Q-switched Nd:YAG laser was used to produce 10 ns long pulses of 1064 nm light. Pulses of the order of 5 mJ were focused to a spot size approximately 150 μm radius. The instantaneous power of these pulses was around 0.5 MW, with intensity over the illuminated area greater than 2.2 GW/cm². This intensity is sufficient to induce ablation in most absorbing materials. The laser was operated at its minimum pulse energy to remain below the threshold of laser induced breakdown (LIB) of the pellet material. Dielectric breakdown results in ionization of the material and the formation of plasma, which can lead to undesirable chemical processes.

The rate of energy deposition is much greater than the heat transfer processes necessary to achieve thermal equilibrium, thus the illuminated volume in the liquid achieves vaporizationor breakdown. The extremely rapid transition to the gas or plasma phase generates a mechanical shockwave in the fluid which is then transferred to the solid, resulting in a limited area of shockwave consolidation as shown in FIGS. 12A-B. The pressure may saturate above a threshold power density depending on the overlay medium, wavelength and pulse width. Equations of state of materials, phase diagrams and dynamics are required to determine the true behavior of these shock waves.

Figures 13A, 13B:
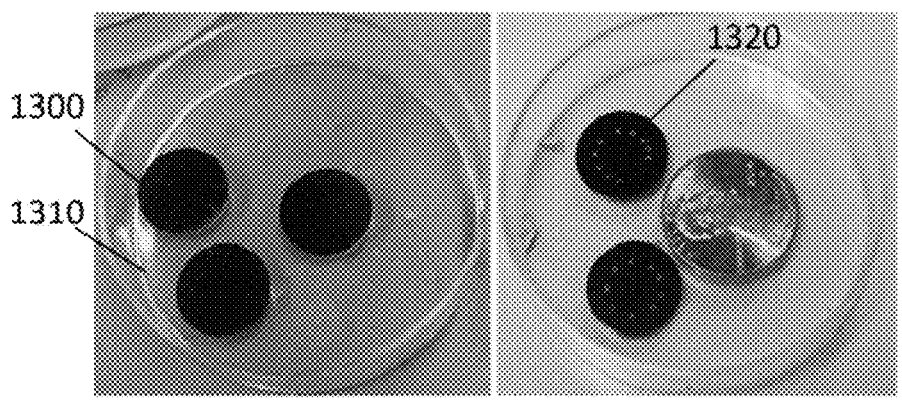
FIGS. 13A-B show samples before and after the laser shock consolidation, respectively.

The pellets 1300 were coated with black paint (the ablating material) and dried prior to the experiment. The pellet target was placed in a sample holder with a small volume of deionized water 1310 upon it. A front surface metal mirror was used to direct the beam down through a BK7 lens which produced an optical focus within the water at or near the pellet/water interface. The pellet was coated with glossy black paint (the ablative layer shown in FIGS. 12A-13) to prevent ablation of the sample surface as shown in FIGS. 13A-B. Laser shots 1320 on the sample can be clearly seen due to the vaporized paint.

Figure 14:
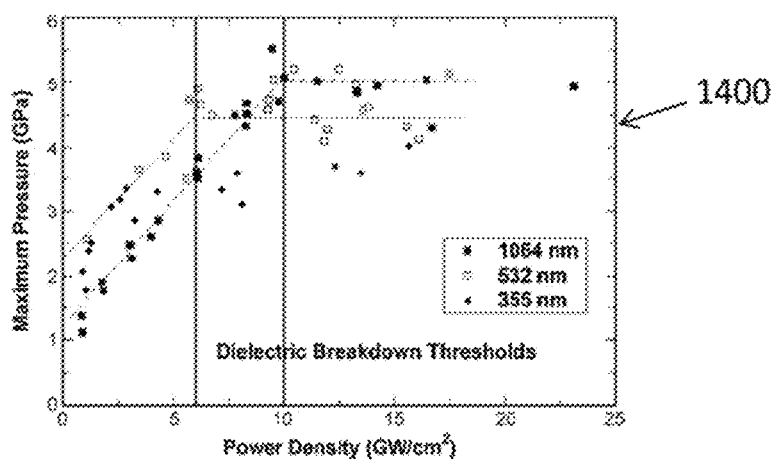
FIG. 14 shows peak pressures developed in that process as a function of power density and wavelength in water-confining medium.

The peak pressures developed in the process as a function of power density and wavelength in water-confining medium 1400 are illustrated in FIG. 14. Based on the calculated power density of 2.2 GW/cm², the peak pressures at which the samples were compacted are about 1.8-2 GPa. The pressures are similar to that obtained using shock tube experiments.

Analysis of the thermal evolution of the target paint area was conducted using published materials data for the material (Table 2) and dimensional estimates of the size of the illuminated area and layer thickness (Table 3). The rate of energy deposition (ns) is much faster than the thermal conduction rate (~μs). Due to this disparity it is possible to ignore the effect of thermal diffusion during the illumination. The energy required to induce a phase change in the target area is much smaller than the instantaneous power, so that on the nanosecond timescale the phase change is instantaneous. The paint ablates instantaneously to produce the plasma that results in shockwaves into the subsequent layer of the sandwich.

TABLE 2

Physical properties of YSZ ceramic and paint material

| YSZ Properties | | |
|---|---|---|
| Thermal Conductivity | 1.8 | W/m-K |
| Thermal Expansion | 9.20E−06 | K⁻¹ |
| $T_m$ (melting point) | 2993 | K |
| Paint | | |

TABLE 2-continued

Physical properties of YSZ ceramic and paint material

| Cp | 5.86 | J/g-K |
|---|---|---|
| Density | 1 | g/cm³ |
| $T_m$ (melting point) | 593 | K |
| Enthalpy Fusion | 150 | J/g |

TABLE 3

Laser shockwave consolidation process parameters

| Layer Depth | 100 | μm |
|---|---|---|
| Spot Radius | 100 | μm |
| Pulse Length | 10 | ns |
| Pulse Energy | 10000 | μJ |
| Target Volume | 3.14E−06 | cm³ |
| Avg. Pulse Power | 1000 | kW |
| Avg. Pulse Intensity | 3.18 | GW/cm² |

Figure 15:
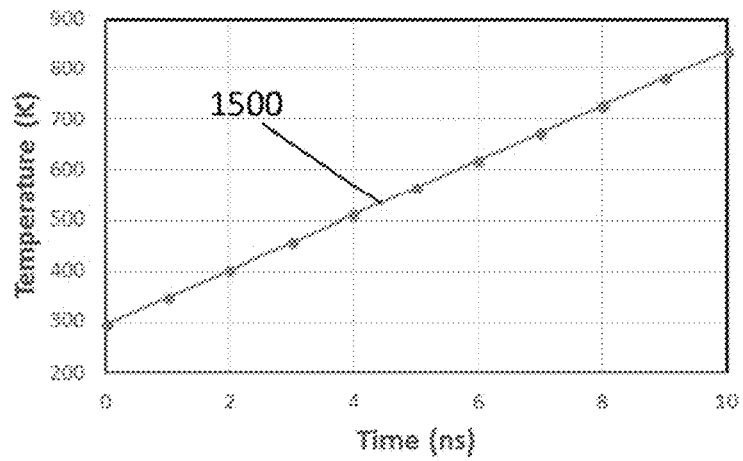
FIG. 15 shows temperature of laser ablation of paint as a function of pulse duration.

The resulting local temperature profile 1500 for the target region is nearly linear in time as shown in FIG. 15. For the present examples, a 10 ns laser pulse exposure generates nearly 836 K in the ablated paint layer. It is expected that the substrate material is subjected to the temperature generated at the interface. However the temperature (836 K) is not sufficient to induce phase change or sintering in the YSZ sample as the phase is stable to 2973 K. Conventional sintering of YSZ is performed by heating the green compact n a furnace at 1450° C. for several hours to achieve full density (>96%).

The heat generated from the CW and long-pulse laser can have adverse effects on materials melting, peeling, chipping, melt splatter and substrate damage. By using picosecond or femtosecond lasers, however, these undesirable side effects may be mitigated or eliminated completely. Ultrafast lasers provide an avenue into a number of new microprocessing applications because of their capability for athermal ablation and extremely high peak power.

Examples 1 & 2—Chemical/Structural Characterization and Investigation of Equation of State Both example material systems were examined morphologically and chemically, and example system 1 (YSZ and YSZ CNT) was mechanically tested and example system 2 (core-shell SDC-Na₂CO₃) was electrically characterized. SEM, TEM and X-ray diffraction were used for morphology and chemical analysis. A nano-indenter was used for hardness and Young's modulus measurement. Electrical characterization was performed using impedance measurements of samples via two-electrode cell setup. Results for YSZ and YSZ CNT are given first followed by those for core-shell SDC-Na₂CO₃.

CNT-YSZ Nanocomposite

These samples consisted of consolidated YSZ and YSZ-CNT (1, 3, and 5 wt. %). Density of the shock compacted samples was measured using the Archimedes method (Table 4). The initial static density of the mechanically mixed powder pressed in a 13 mm die under 350 MPa load was determined prior to shock compaction. The densities of CNT-YSZ samples show an increasing trend with increasing CNT content, except for the 5 wt. % CNT sample. Compacted sample densities follow the similar trend as that of initial densities. The 3 wt. % CNT-YSZ, sample exhibited higher density than the other compositions, similar to that observed from the shock Hugoniot state measurements.

TABLE 4

Density calculations of Shockwave compacted YSZ-CNT nanocomposites

| Sample | Initial Static Density (g/cc) | Final Compacted Density (g/cc) | Theoretical Maximum Density (TMD)* (%) |
|---|---|---|---|
| YSZ | 3.362 | 4.646 | 76.2 |
| 1 wt. % CNT-YSZ | 3.503 | 4.586 | 75.2 |
| 3 wt. % CNT-YSZ | 3.550 | 5.477 | 89.8 |
| 5-wt. % CNT-YSZ | 3.439 | 4.892 | 80.7 |

Note: *TMD = measured density/theoretical density

Theoretical density of Yttria stabilized Zirconia (YSZ) =6.10 g/cc

Scanning electron microscope images of YSZ showed highly compacted regions. At higher magnification, particle interfaces are diffuse and unclear, indicating strong bonding caused by shock pressure and interfacial frictional heat. The void content indicates that the sample is well below the theoretical maximum density of YSZ however.

SEM images for 5% CNT-YSZ showed similarly highly consolidated regions. The YSZ particles are closely packed to form large agglomerates with CNTs embedded at the interfaces. TEM clearly shows a uniform dispersion of CNTs and bonding with the YSZ particles. At higher magnification, the interfaces between YSZ particles are fused with CNTs tightly packed, indicating strong bonding. The CNTs remain structurally intact and strongly bound to the YSZ particles.

Mechanical Property Evaluation

The mechanical properties of the resulting materials were evaluated: hardness, bulk modulus, tensile properties and toughness. Nanoindentation technique was used for this purpose. The indentation test consists of performing a print at the surface of a material by the penetration of a hard indenter at a given indentation load. For this purpose, the indenter may have different geometries; spherical, conical or pyramidal, the Objective being to produce an elastoplastic deformation of the material below the indenter. The indentation load can be chosen in the nano-, micro- or macro-indentation ranges, allowing the study of local or global mechanical properties. The mechanical properties are determined by analyzing the geometrical dimensions of the residual indent (usual indentation) or from the analysis of a load-depth curve (instrumented indentation tests). Nanoindentation was performed according to ASTM E-2546 and the details of test parameters are illustrated in Table 5.

TABLE 5

Parameters and details of Nano-indentation test

| Maximum Force (mN) | 100 |
| Loading Rate (mN/min) | 200 |
| Unloading Rate (mN/min) | 200 |
| Creep (s) | 10 |
| Computation Method | ASTM E-2546; Oliver & Pharr |
| Indenter Type | Berkovich |

Figures 16A, 16B:
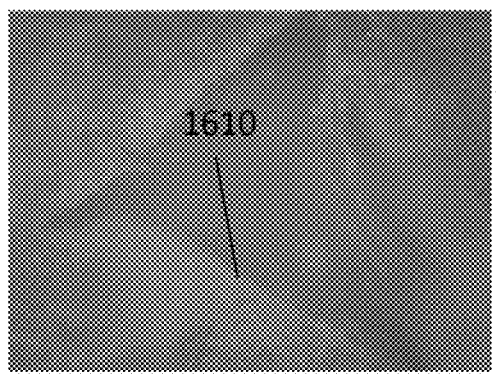
FIGS. 16A-B show a Berkovich nano-indenter tip profile and test data for 3 wt. % CNT-YSZ, respectively.

The consolidated sample was mounted on an aluminum holder using epoxy, exposing the top surface for nano-indentation. The Berkovich pyramidal tip profile 1610 and test data 1620 for 3 wt. % CNT-YSZ sample are shown in FIGS. 16A-B. An average of five readings was used to calculate the properties.

The \Tickers hardness, nano-hardness and Young's modulus of the nanocomposite samples are higher than base YSZ (Table 6). The values increase with increasing content of CNTs from 1 to 3 wt. % while the 5 wt. % CM' sample shows a decrease. The latter is likely due to CNT agglomeration at the particle interfaces. The improved hardness and modulus of 3 wt. % CNT-YSZ is attributed to high density obtained in the shock compaction experiment.

TABLE 6

Measured hardness and modulus of YSZ and CNT-YSZ nanocomposites using Vickers and Nano indenter

| Sample | Hardness [Vickers] | Hardness [GPa] | Young's Modulus [GPa] | Max Depth [nm] |
|---|---|---|---|---|
| YSZ | 30.2 ± 13.7 | 0.378 ± 0.15 | 6.2 ± 7.0 | 3975 ± 195 |
| 1% CNT-YSZ | 43.0 ± 8.8 | 0.455 ± 0.10 | 9.6 ± 0.8 | 3452 ± 309 |
| 3% CNT-YSZ | 75.4 ± 12.2 | 0.798 ± 0.13 | 27.4 ± 4.8 | 2483 ± 146 |
| 5% CNT-YSZ | 42.9 ± 3.8 | 0.454 ± 0.04 | 6.8 ± 0.7 | 3604 ± 156 |

It is believed that CNTs can only be wetted by liquids or molten metals with low surface tension at a cut-off limit lying between 100 and 200 mN/m. This explains why most metals such as aluminum (surface tension of 865 mN/m), copper (1270 mN/m) or iron (1700 mN/m) are unable to wet the surface of carbon nanotubes and achieve high interfacial adhesion. From the results in the table above, it is summarized that the wettability between CNTs and CNT-YSZ is weak due to low mechanical energy provided by the milling method. To address this wettability issue two additional types of filler may be synthesized: (i) CNTs grown on zirconia nanoparticles and (ii) zirconia nanoparticle attached to CNTs via hydrothermal reaction.

Laser Shock Consolidation of CNT-YSZ Nanocomposite

Samples of CNT-YSZ were laser shock consolidated according to the methods described previously. Characterization was performed using an SEM and nano-indentation testing methods.

From SEM, highly compacted regions were observed for laser treated samples. At higher magnification, YSZ particles could be seen to be fused together at interfaces with CNTs between. The CNTs were intact, confirming that the laser shot did not produce sufficiently high temperatures to break them down.

The laser shockwave processed samples were tested for mechanical properties. The indentation test was performed on the laser treated spots (~170-200 μm) with test results shown in FIG. 17, including Vickers hardness 1710, hardness in GPa 1720, Young's Modulus 1730, and max depth 1740 for each of the tests 1750.

TABLE 7

Measured hardness and modulus of Laser shockwave processed YSZ and CNT-YSZ nanocomposites using Vicker's and Nano-indenter

| Sample | Hardness [Vickers] | Hardness [GPa] | Young's Modulus [GPa] | Max Depth [nm] |
|---|---|---|---|---|
| YSZ | 57.2 ± 7.9 | 0.606 ± 0.083 | 16.9 ± 1.3 | 2888 ± 165 |
| 3% CNT YSZ | 602.7 ± 27.4 | 6.378 ± 0.29 | 103.2 ± 6.8 | 962 ± 14 |
| 5% CNT YSZ | 35.5 ± 2.6 | 0.376 ± 0.028 | 14.4 ± 3.5 | 3564 ± 178 |

The 3 wt. % CNT-YSZ shows a significant improvement in hardness (900%) and Young's modulus (500%) compared to base YSZ (Table 7). 5 wt. % CNT-YSZ sample shows lower values however compared to both YSZ and the 3 wt. %. This is likely due to agglomerated CNTs in the bulk resulting in non-homogeneous mechanical properties. Clearly laser shockwave processing consolidated the nanocomposites.

SDC-Na$_2$CO$_3$ Nanocomposite

Figures 17, 18:
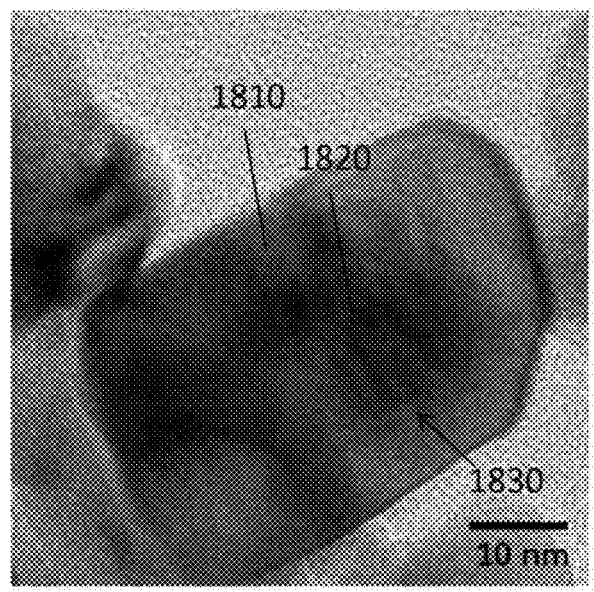
FIG. 17 shows nano-indentation test data for 3% CNT-YSZ.
FIG. 18 is a TEM image of $Na_2CO_3$-SDC nanocomposite powder after shockwave consolidation.

Shockwave compacted SDC-Na$_2$CO$_3$ samples were analyzed using TEM as shown in FIG. 18. The Na$_2$CO$_3$ shell 1820 and SDC core 1810 could be clearly seen due to the large contrast difference between them. The dominant lattice fringes 1830 can be seen in the SDC core; the distance between parallel fringes is equal to the spacing of the {111} planes in SDC crystal shown in FIG. 18. Meanwhile, the lattice fringes are not observed in Na$_2$CO$_3$ shell layer due to its amorphous nature. It can be seen that there is no change in particle size and morphology in comparison to the precursor powders.

Figure 19:
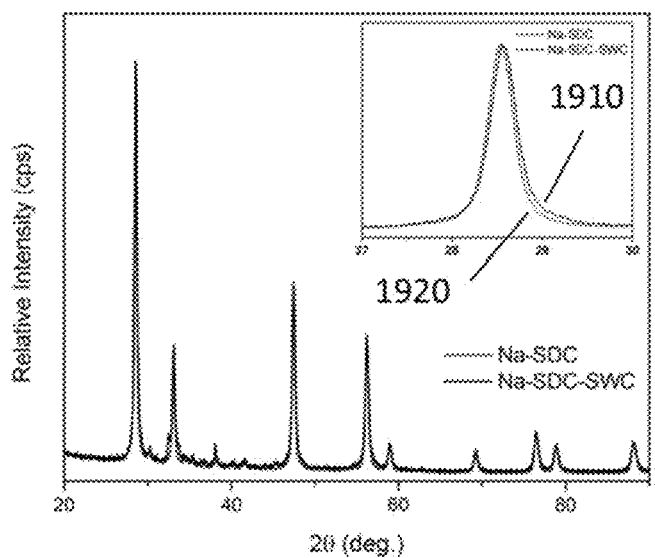
FIG. 19 shows XRD plots comparing the crystal structure before and after the shockwave consolidation.

X-ray diffraction (XRD) analysis as shown in FIG. 19 supports the above observation. There is no significant difference between Na-SDC 1920 and Na-SDC-SWC 1910 (compacted) in peak width or shift in peak position that corresponds to particle size modification or phase change. Hence, the particle size and chemistry of SDC-Na$_2$CO$_3$ nanocomposite remains unchanged upon shockwave consolidation.

Electrical Conductivity Measurement

Conductivity of the SDC-Na$_2$CO$_3$ nanocomposite was determined using AC impedance analysis in the range 5 Hz to 2 MHz using a PARSTAT 2273 frequency response analyzer (FRA) with an applied signal of 20 mV and a two electrode cell. Measurements were carried out under a range of temperatures and atmospheric pressure. Under air (pO2=0.21 atm) the temperature was varied from 200 to 650° C. in 25-50° C. increments with a dwell time of 30 min at each temperature to achieve equilibrium. Equivalent circuit fitting to the impedance data was performed using the commercial software package ZView (Scribner Associates).

The conductivity cell was constructed with materials (2" alumina discs, ¼" silver discs and stainless steel threaded rods) to sustain high temperatures (~1000° C.) and the design ensures that the sample is in good contact with the silver electrodes. The sample powder was pressed with a 13 mm diameter die under 350-400 MPa. Platinum conductive paste was applied on both surfaces of the sample and cured at 975° C. for 15 min. A horizontal tube furnace (Thermolyn 79300) was used for impedance measurements in the temperature range from 200 to 600° C. in air.

Figure 20:
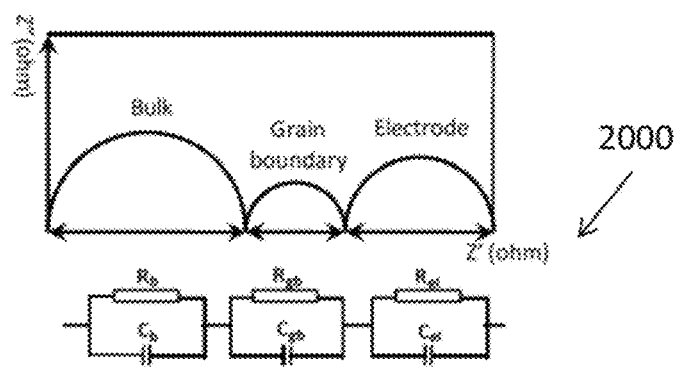
FIG. 20 is a typical impedance plot for a polycrystalline sample with equivalent circuit.
Figure 21:
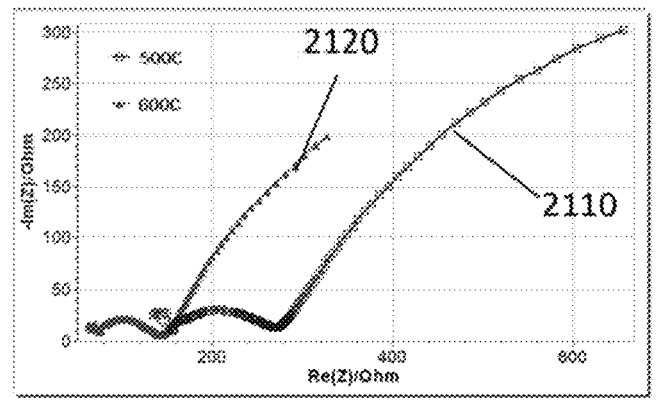
FIG. 21 shows impedance plots for SDC-$Na_2CO_3$ composite at two different temperatures.

FIG. 20 is a typical impedance plot 2000 for a polycrystalline sample with equivalent circuit. As shown in FIG. 21, the impedance spectra at high temperatures 500 C 2110 and 600 C 2120 displayed two electrolyte-related arcs in the Nyquist representation ($-Zi(\omega)$ vs. $Zr(\omega)$, where Zi is the imaginary component of the impedance, Zr is the real component, and w is frequency), in which the high-frequency arc could be attributed to the bulk response and the intermediate frequency arc to the grain boundary response. Accordingly, the data were analyzed in the framework of the brick layer model, in which the grain boundary arc is understood to result from high impedance grain boundaries in series with the intermediate impedance grain interiors. Consistent with the brick layer model, the impedance behavior was represented using two parallel (RQ) circuits placed in series, where Q is a constant-phase-element (CPE) that accounts for non-ideal capacitance and R is resistance. For a sample with a length of L and cross sectional area of A, the bulk conductivity, $\sigma_b$, and the grain boundary conductivity, $\sigma_{gb}$, can be expressed as $\sigma_b = L/AR_b$ and $\sigma_{gb} = L/AR_{gb}$ where $R_b$ and $R_{gb}$ are respectively the bulk and grain boundary resistance.

The total electrical conductivity, $\sigma_T$, can be calculated from $1/\sigma_T = 1/\sigma_b + 1/\sigma_b$.

Figure 22:
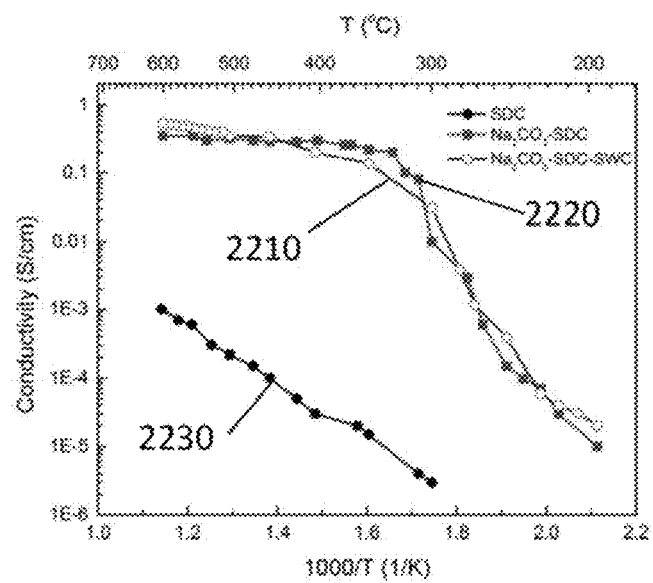
FIG. 22 shows temperature dependence of conductivity for commercial SDC, SDC-$Na_2CO$ pellet annealed at 700° C. and shockwave consolidated SDC-$Na_2CO_3$ composite.

FIG. 22 shows the temperature dependence of conductivity for a shockwave consolidated SDC-Na$_2$CO$_3$ nanocomposite 2210, mechanically pressed SDC-Na$_2$CO$_3$ 2220 and SDC 2230. The conductivity increases linearly with temperature for SDC from 300 to 600° C. However, for SDC-Na$_2$CO$_3$ a sharp increase around 300° C. is noted, likely related to the glass transition temperature. The conductivity reaches over 0.1 Scm$^{-1}$ above 300 DC and plateaus thereafter to 600° C. It can be seen that shockwave consolidation has retained the conductivity of SDC-Na$_2$CO$_3$ composite due to improved bonding between the particles, retention of particle size and increased density, in contrast to conventional thermal sintering (1000-1350° C.) which will decompose the Na$_2$CO$_3$ layer, leading to a decrease in conductivity.

The invention is not limited to the particular embodiments illustrated in the drawings and described above in detail. Those skilled in the art will recognize that other arrangements could be devised. The invention encompasses every possible combination of the various features of each embodiment disclosed. One or more of the elements described herein with respect to various embodiments can be implemented in a more separated or integrated manner than explicitly described, or even removed or rendered as inoperable in certain cases, as is useful in accordance with a particular application While the invention has been described with reference to specific illustrative embodiments, modifications and variations of the invention may be constructed without departing from the spirit and scope of the invention as set forth in the following claims.

We claim:

1. A shock consolidation material manufacturing method, comprising:
combining a nanoscale additive and ceramic nanoparticles to create a nano-powder;
compacting the nano-powder mechanically; and
performing shock-wave consolidation on the compacted nano-powder,
wherein the ceramic particles comprise Samarium doped Ceria (SDC) and the nanoscale additive comprises Na$_2$CO$_3$, wherein the nano-powder is core-shell SDC-Na$_2$CO$_3$, and wherein the core-shell SDC-Na$_2$CO$_3$ particles have SDC cores in a size range of 20-60 nm and Na$_2$CO$_3$ shells in a size range of 2-4 nm.

2. The shock consolidation material manufacturing method of claim 1, wherein the ceramic nanoparticles further comprise Yttria-stabilized tetragonal Zirconia (YSZ).

3. A shock consolidation material manufacturing method, comprising:
combining a nanoscale additive and ceramic nanoparticles to create a nano-powder;
compacting the nano-powder mechanically; and
performing shock-wave consolidation on the compacted nano-powder,
wherein the shock-wave consolidation is performed with a laser, and comprises:
positioning the nano-powder on a support material;
placing an ablative layer over the support material and nano-powder;
placing a transparent re-usable capping layer over the ablative layer; and
directing laser energy at the capping layer, turning an area of the ablative layer below the capping layer into plasma and generating shock waves through the nano-powder and support material,
wherein the laser energy is of a wavelength of 1064 nm and is directed in pulses of 10 ns long.

4. The method of claim 3, wherein the laser energy is directed to a portion of the capping layer having spot size ds which is moved across the capping layer at a raster speed on the order of magnitude of the ratio of ds to a pre-determined characteristic consolidation process time tc of the nano-powder and support material.

5. The method of claim 3, wherein the laser energy is directed using a linear array of lasers to a portion of the capping layer comprising a line of overlapping spots of size ds, which is moved linearly across the capping layer at a raster speed on the order of magnitude of the ratio of ds to a pre-determined characteristic consolidation process time tc of the nano-powder and support material.

6. The method of claim 3, wherein the pulses are 5 mJ, and wherein the laser energy is focused to a spot size of 150 µm with an instantaneous power of 0.5 MW and intensity over the illuminated area of over 2.2 GW/cm$^2$.

7. The method of claim 3, wherein the ablative layer comprises glossy black paint.

8. A shock consolidation material manufacturing method, comprising:
combining a nanoscale additive and ceramic nanoparticles to create a nano-powder;
compacting the nano-powder mechanically; and
performing shock-wave consolidation on the compacted nano-powder,
wherein the nanoscale additive comprises carbon nanotubes comprising 1-3% by weight of the nano-powder.

9. A shock consolidation material manufacturing method, comprising:
combining a nanoscale additive and ceramic nanoparticles to create a nano-powder;
compacting the nano-powder mechanically; and
performing shock-wave consolidation on the compacted nano-powder,
wherein the shock-wave consolidation is performed with a gas gun, and wherein the gas gun is an 80-mm barrel diameter, 10 m, single-stage light gas gun with three-capsule fixture and a velocity of 1050 m/s.

10. The method of claim 1, wherein the shock-wave consolidation occurs within a microsecond timescale.

11. A shock consolidation material manufacturing method, comprising:
combining a nanoscale additive and ceramic nanoparticles to create a nano-powder;
placing the nano-powder on a surface of a support material in a predetermined design; such that some portions of the support material surface are not covered by the nano-powder;
pressing a continuous glass piece over the entire surface of the support material;
compacting the nano-powder mechanically; and
performing shock-wave consolidation on the compacted nano-powder,
wherein the shock-wave consolidation is performed on the entire surface.

12. The method of claim 11, further comprising placing further nano-powder on the shock-wave consolidated surface in a predetermined design, such that some portions of the shock-wave consolidated surface are not covered by the nano-powder, pressing a continuous glass piece over the entire surface of the shock-wave consolidated surface, and performing further shock-wave consolidation on the entire shock-wave consolidated surface.

13. The method of claim 12, further comprising placing a binding layer over the shock-wave consolidated surface before placing the further nano-powder.

14. The method of claim 11, further comprising placing an ablative layer over the support material surface and below the glass piece.

15. The method of claim 1, wherein compacting the nano-powder mechanically comprises die pressing it under a 350-400 MPa load.

16. The method of claim 1, wherein combining a nanoscale additive and ceramic nanoparticles to create a nano-powder comprises ball milling the nanoscale additive with the ceramic particles.

17. A shock consolidation material manufacturing method, comprising:
combining a nanoscale additive and ceramic nanoparticles to create a nano-powder;
compacting the nano-powder mechanically; and
performing shock-wave consolidation on the compacted nano-powder,
wherein the combining step comprises growing carbon nanotubes on the ceramic nanoparticles using chemical vapor deposition.

18. A shock consolidation material manufacturing method, comprising:
combining a nanoscale additive and ceramic nanoparticles to create a nano-powder;
compacting the nano-powder mechanically; and
performing shock-wave consolidation on the compacted nano-powder,
wherein the combining step comprises growing the ceramic nanoparticles on carbon nanotubes by functionalizing multi-walled carbon nanotubes with carboxylic groups using an acid treatment to ensure a hydrophilic surface, followed by attachment of the ceramic nanaparticles using a hydrothermal process.

19. The method of claim 18, wherein the hydrothermal process comprises dissolving of the ceramic nanoparticles in water, addition of the multi-walled carbon nanotubes, and heating in a pressure reaction vessel, further comprising removing a layer of floating solids and removing ceramic-CNTs therefrom.

20. The method of claim 3, wherein the pulses are approximately 5 mJ, and wherein the laser energy is focused to a spot size of approximately 150 µm.

21. A shock consolidation material manufacturing method comprising, combining a nanoscale additive and ceramic nanoparticles to create a nano-powder;
compacting the nano-powder mechanically; and
performing shock-wave consolidation on the compacted nano-powder,
wherein the shock-wave consolidation is performed with a laser, and comprises;
 positioning the nano-powder on a support material;
 placing an ablative layer over the support material and nano-powder;
 placing a transparent re-usable capping layer over the ablative layer; and
 directing laser energy at the capping layer, turning an area of the ablative layer below the capping layer into plasma and generating shock waves through the nano-powder and support material,
 wherein the laser energy is directed in between 5-10 ml pulses, and focused to a spot size of between 100-200 µm.

22. A shock consolidation material manufacturing method, comprising:
combining a nanoscale additive and ceramic nanoparticles to create a nano-powder;
compacting the nano-powder mechanically; and
performing shock-wave consolidation on the compacted nano-powder,
wherein the shock-wave consolidation is performed with a laser, and comprises:
 positioning the nano-powder on a support material;
 placing an ablative layer over the support material and nano-powder;
 placing a transparent re-usable capping layer over the ablative layer; and
 directing laser energy at the capping layer, turning an area of the ablative layer below the capping layer into plasma and generating shock waves through the nano-powder and support material,
 wherein the laser energy is directed in pulses of 10 ns in duration, and focused to a spot size of between 100-200 µm.

23. The method of claim 21, wherein the laser energy has an intensity over the illuminated area of over 2.2 $GW/cm^2$.

24. The method of claim 21, wherein the laser energy has an intensity over the illuminated area between 2.2 $GW/cm^2$ and 3.18 $GW/cm^2$.

25. The method of claim 23, wherein the pulses of the laser energy are 10 ns in duration.

26. The method of claim 25, wherein the laser energy is of a wavelength of 1064 nm.

27. The method of claim 24, wherein the pulses of the laser energy are 10 ns in duration.

28. The method of claim 27, wherein the laser energy is of a wavelength of 1064 nm.

\* \* \* \* \*